United States Patent
Ross et al.

(10) Patent No.: US 9,369,260 B2
(45) Date of Patent: Jun. 14, 2016

(54) DIVISION FREE DUPLEXING NETWORKS

(75) Inventors: John Anderson Fergus Ross, Niskayuna, NY (US); Michael James Hartman, Clifton Park, NY (US); John Erik Hershey, Niskayuna, NY (US); Richard Louis Zinser, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 365 days.

(21) Appl. No.: 12/757,721

(22) Filed: Apr. 9, 2010

(65) Prior Publication Data

US 2011/0249596 A1     Oct. 13, 2011

(51) Int. Cl.
*H04L 5/14* (2006.01)
*H04W 74/00* (2009.01)
*H03H 21/00* (2006.01)

(52) U.S. Cl.
CPC .......... *H04L 5/14* (2013.01); *H03H 2021/0089* (2013.01); *H04W 74/002* (2013.01)

(58) Field of Classification Search
CPC .............................................. H04L 5/14–5/26
USPC ......... 370/276–296, 431, 436, 437, 441–444, 370/465, 468, 478–480
See application file for complete search history.

(56) References Cited

U.S. PATENT DOCUMENTS

| 2003/0031242 A1 | 2/2003 | Awad |
| 2004/0213170 A1 | 10/2004 | Bremer |
| 2011/0222445 A1* | 9/2011 | Alanara ........................ 370/281 |

FOREIGN PATENT DOCUMENTS

WO     2004071004 A1     8/2004

OTHER PUBLICATIONS

Chen et al.; Division-Free Duplex for Wireless Applications; Electronic Letters; Jan. 22, 1998, vol. 34, No. 2.
Lin, Yuxia, et al., "Frame Aggregation and Optimal Frame Size Adaptation for IEEE 802.11n WLANs," Global Telecommunications Conference, Nov. 1, 2006, pp. 1-6.
Smiley, Charles R., "Exchange Data Between Digital Systems," Digital Systems, Apr. 26, 1977, pp. 96-98, vol. 25, No. 9, Cleveland, USA.
EP Search Report and Written Opinion issued Mar. 27, 2014 in connection with corresponding EP Patent Application No. 11160945.9.

* cited by examiner

*Primary Examiner* — Pao Sinkantarakorn
(74) *Attorney, Agent, or Firm* — Jean K. Testa; Fletcher Yoder, P.C.

(57) ABSTRACT

Provided are methods and systems of using division-free duplexing (DFD) in a communication network. Techniques for applying DFD in a communication network may decrease bottlenecks in the network by allowing one or more network nodes to transmit and on substantially the same frequency and at substantially the same time. In one embodiment, one or more nodes in the network may be DFD enabled, and may be configured to operate in either a conventional mode or a DFD mode. The mode of operation of DFD enabled nodes may depend on the quality of signals transmitted to and/or received at the DFD enabled nodes. Further, the mode of operation may change dynamically, and may be substantially controlled by any suitable processor in the network.

23 Claims, 4 Drawing Sheets

DIVISION FREE DUPLEXING NETWORKS

BACKGROUND

The subject matter disclosed herein relates to communication systems, and more particularly, to systems and methods of conducting a communication using division free duplexing.

A wireless communication network may include multiple communication devices capable of communicating wirelessly. Communications may be made between the multiple communication devices through various communication routes. Depending on the configuration of the network, communication routes may be made from one communication device to another via central network nodes which connect the devices, or communication routes may include links between any devices of the network. For example, a communication network may include one or more subnetworks, each with one or more central network nodes which link several devices (e.g., cellular phones) within subnetworks of the communication network. Devices in the network may communicate via links within and between the subnetworks. Networks may also be configured such that links may be formed between any of the devices of the network, and for a first device to communicate with a second device, links may be formed from one device to another until a communication route is formed between the first and second devices.

Generally, the communication route between two communicating devices may involve two signals transmitted between the devices, where one signal is transmitted from the first device and received at the second device, and another signal is transmitted from the second device and received at the first device. As the communication route involves the transmission of two different signals, direct interference may occur between the oppositely propagating signals. To avoid interference in network communication routes, duplex communication systems may typically be employed. A duplex system may involve time-division and/or frequency-division to allow two communicating devices to both transmit and receive information (e.g., data, voice signals, etc.). For example, time-division duplexing may use time-division multiplexing to separate incoming (received) and outgoing (transmitted) signals. As incoming and outgoing signals may be separated in time, the signals may be carried on the same frequency. Furthermore, the time-division of the signals may be sufficiently fast such that signals may be perceived as being transmitted and received simultaneously. Frequency-division duplexing may involve signal transmitters and receivers which operate on different frequencies. The frequencies of the transmitted and received signals may be sufficiently separated such that their modulated frequency spectra do not overlap. The receiver of each communication device may be tuned to receive an intended frequency and reject its own transmitted signal. By transmitting signals through different frequency spectra, the transmitting and receiving of signals may occur simultaneously.

Although division duplex systems may enable the near-simultaneous transmitting and receiving of signals, such systems may be insufficient for some communication networks, which have become increasingly complex. For example, networks using time-division duplex systems may lose time in receiving the signals due to the time-multiplexing of signals, and networks using frequency-division duplex systems may have a limited amount of frequency spectra available for transmission links which support an increasingly large number of communication devices.

BRIEF DESCRIPTION

In one embodiment, a method of managing a communication in a communication network is provided. The method includes operating a network node in the network using a conventional duplexing technique and monitoring transmissions from the network node to determine an expected performance for a division free duplexing (DFD) mode of operation. If the expected performance for DFD operation reaches a threshold performance level, the network node may cease to operate in the conventional duplexing mode and begin operating using a DFD technique.

Another embodiment provides a communication system including a plurality of nodes. One or more nodes of the plurality of nodes, referred to as division free duplex (DFD) enabled nodes, include DFD equipment and are configured to operate in either a DFD mode or a conventional mode. The system also includes a processor configured to substantially control a mode of operation of the DFD enabled nodes.

Yet another embodiment provides a method for operating a first node and a second node in a communication network by using a conventional duplexing technique and also operating the first node and the second node by using a division free duplexing (DFD) technique. The operating techniques of the first node and the second node are dynamically changeable based on the monitored quality of the communication between the first node and the second node.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

A communication network may be an interconnection of devices capable of communicating (e.g., transmitting and receiving data, speech, etc.) with other devices in the network. A communication between two devices in the network may be made through a communication route of links connecting the two devices. For example, in a communication between a first device and a second device, a communication route may refer to a series of links which connect the first and second devices. A "link" may refer to a connection, a transferred signal, etc., and depending on the configuration of the network, links may be made between any communication devices in the network or between devices and other nodes or controllers in the network.

During a communication, each of the communicating devices may transmit and receive signals. For example, two communicating cellular phones may transmit and receive voice signals (or modulated voice signals) to enable a conversation. Thus, each communication device within the network may include a transceiver, or a transmitter to transmit signals and a receiver to receive incoming transmissions. However, because the two communicating devices are transmitting and receiving different signals from substantially opposite directions along a communication route, interferences may occur between the two signals. While division duplex techniques such as time-division duplexing and frequency-division duplexing may enable a two-way communication route, such division duplex systems may have limitations in a more complex communication network.

Figure 1:
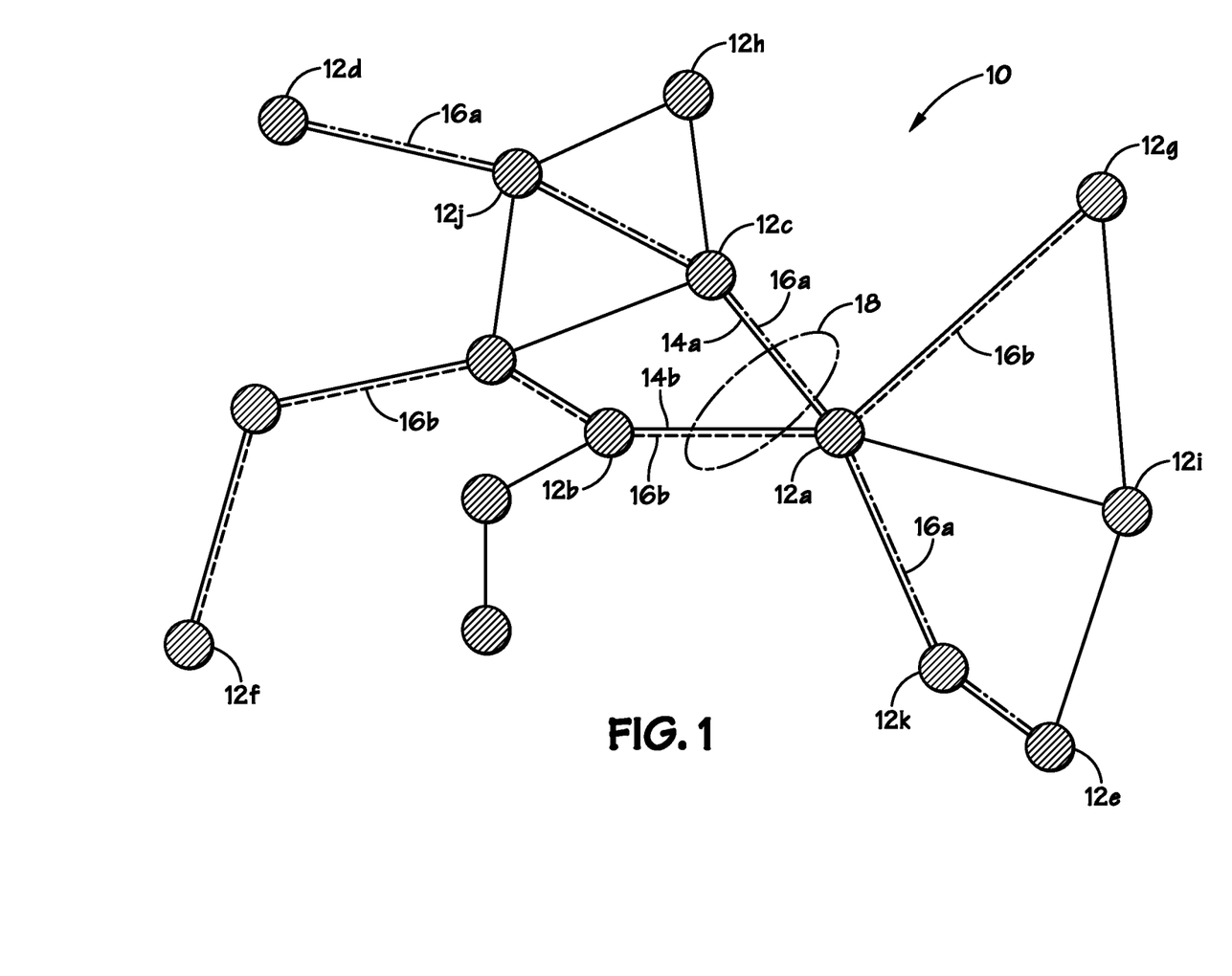
FIG. 1 is an example of a wireless communication system having division-free duplexing capabilities, in accordance with embodiments of the present techniques.

The diagram illustrated in FIG. 1 represents a communication network 10 having multiple network nodes 12 which may each represent communication devices. The network 10 may have a mesh configuration, where each of the nodes 12 (also referred to as devices 12) may be a device suitable for linking with other devices in the network 10. For example, device 12a may be linked to device 12c via link 14a, and device 12a may be linked to device 12b via link 14b. A communication between two devices 12 in the network 10 may be enabled by a communication route, which may include multiple links formed between the two communicating devices 12. For example, device 12d and device 12e may communicate over a communication route 16a (depicted by dotted lines) which includes links between multiple intermediate devices, such as link 14a between devices 12c and 12a. Further, device 12f and device 12g may communicate over a communication route 16b (also depicted by dotted lines) which also includes links between multiple intermediate devices, such as link 14b between devices 12b and 12a. The network nodes 12 traversed and the links 14 formed in each communication route may depend on the spatial location of the nodes 12 within the network 10 and/or the characteristics of the nodes 12.

Due to the configuration of the network 10 and/or the characteristics of the nodes 12, communication routes between different nodes 12 of the network 10 may sometimes share common links. For example, link 14a may be used in communication route 16a, and also in other communication routes in the network 10, such as a route between devices 12h and 12i, or a route between devices 12j and 12k. Similarly, link 14b may also be used in multiple communication routes, including communication route 16b. Thus, certain links (e.g., 14a and 14b) in a network 10 may be used to complete many communication routes, and may be referred to as rate transmission links 14a and 14b. Such high-transmission rate links 14a and 14b may result in bottlenecking, as depicted by the dotted line 18, which may refer to a high amount of signal transmissions due to multiple communication routes through certain links in a network 10.

While certain division duplex techniques may be used to enable a two-way communication between devices through a link, bottlenecking 18 may result even when such techniques are used. For example, time-division duplexing may be used to time-multiplex signals between the transceivers of the two communicating devices to avoid interferences resulting from simultaneously sending signals through a common spectrum. However, in a network, and especially in a more complex communication network, time-division duplexing may result in delays in received signals, as many signals may be time-multiplexed across a high-transmission rate link (e.g., 14a and 14b). Furthermore, frequency-division duplexing may also be used to transmit signals over different frequencies. Similarly, frequency-division duplexing may result in delays and/or interference, as frequency spectra may be limited, and may not be able to accommodate for the multiple transmissions through a high-transmission rate link. Thus, while division duplexing techniques may work for simpler connections between two devices, bottlenecking 18 in a communication network 10 may result in communication delays and/or data loss.

The present techniques provide methods and systems including a communication network using division-free duplexing. Techniques for applying division-free duplexing in a communication network may decrease bottlenecks in the network by allowing one or more network devices to transmit on substantially the same frequency and at substantially the same time. Such techniques may be applicable for wireless communication (e.g., cellular communication), radio communication, broadcasting, short-range point-to-point communication, wireless sensor networks, and wireless computer networks, etc. Such techniques may also be applied to wire or cable-based communication, including telecommunications, computer networking, powerline carrier systems, twisted pair or coaxial cable communication, or DSL communication.

Division-free duplexing may enable two devices to transmit and receive signals over the same frequency and during the same time by reducing interferences resulting from the oppositely traveling signals. For example, in a communication network, signal interference between transmitted and received signals on co-sited or coupled antennas may result in a received signal including an interference component that is representative of the transmitted signal. During normal operation, the receiver input port will contain two signal components: a strong transmitted signal, and a significantly weaker received signal. Simple subtraction of the transmitted signal at the receiver end is insufficient to eliminate this interference, as the version of the transmitted signal that is received has usually undergone some distortion. The received copy of the transmitted signal may be "corrupted" by effects such as multipath reflected images of the original signal, phase distortion and amplitude changes, and/or delay. Accordingly, a simple subtraction may not account for the type and magnitude of the changes in the transmitted signal interference component of the received signal.

In some embodiments, a software-based adaptive filter may be implemented on one or more devices 12 in a network 10 to time and phase-align the "clean" transmitted signal sampled at a transmitter input port of a device to a "corrupted" version present at the receiver input port. Such techniques may be implemented by high-speed analog-to-digital (A/D) converters and software-controlled digital signal processors. By using two 14-bit converters and a single loop adaptive filter algorithm, narrowband incoming signals that are 100 dB (or lower) below the level of the transmitted signal may be decoded.

Figure 2:
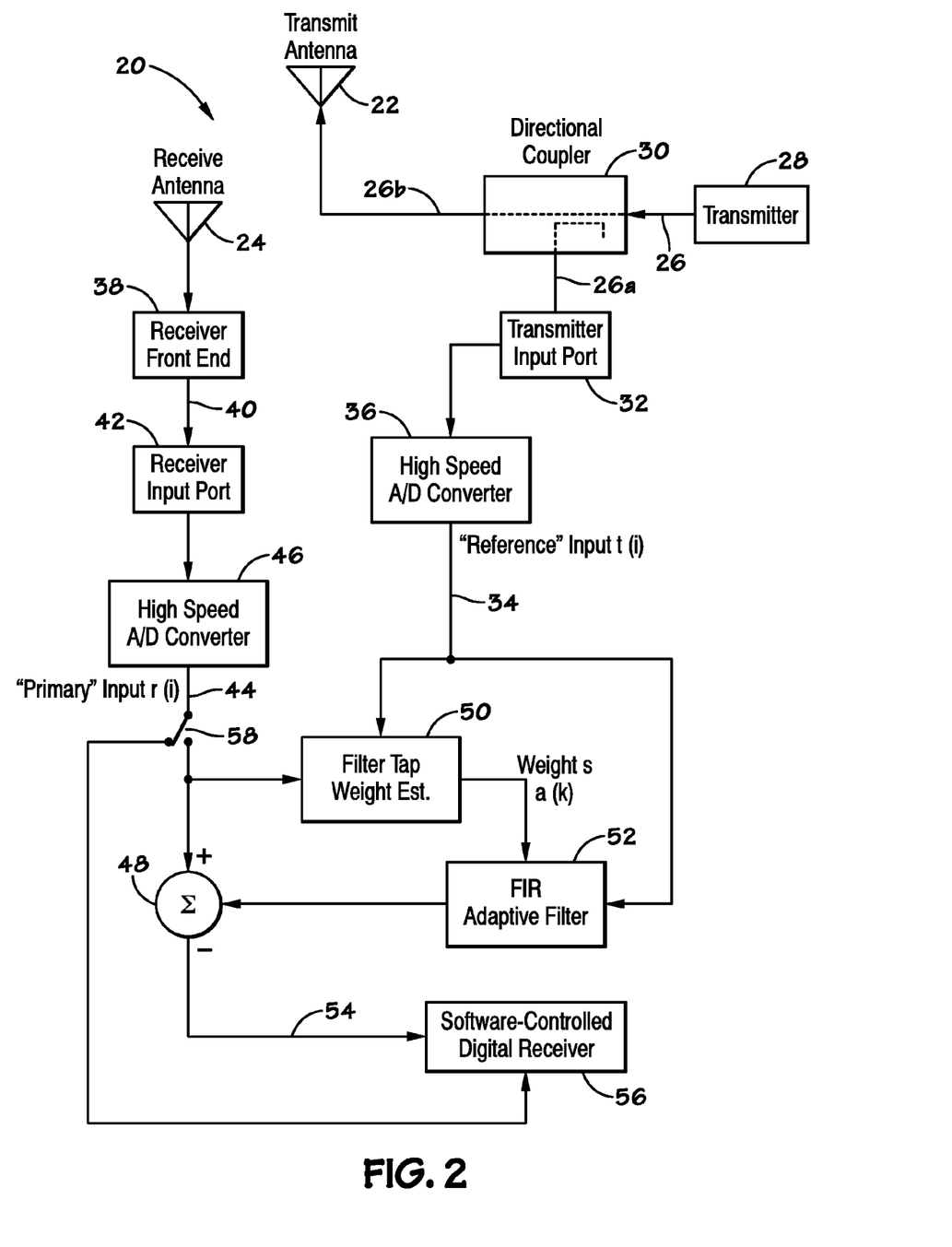
FIG. 2 is an example of a communication network, in accordance with embodiments of the present techniques.

An example of a division-free duplexing (DFD) system which may be implemented on one or more devices 12 in a network 10 is illustrated in FIG. 2. The DFD system 20 may include a transmit antenna 22 and a receive antenna 24. In the transmitter portion of the system 20, a portion of the signal 26 from a transmit source (transmitter 28) is input to a directional coupler 30 to produce an attenuated signal 26a representative of the transmitted signal 26 while the bulk of the signal 26b is input to a transmit antenna 22 and radiated as RF energy. The attenuated signal 26a is input to a transmitter input port 32 and is converted to a digital signal 34 by an A/D converter 36.

In the receiver portion of the system, a radiated RF signal (radiated signal 26b) may be received by a receive antenna 24 and passed through a receiver front end 38 to produce a received signal 40. Some embodiments may involve cable or wire-based communication, and a cable signal may be directly passed to the receiver front end 38 without being received at the antenna 24. The receiver front end 38 may include analog amplifiers and/or filters, such as a wideband buffer amplifier. The received signal 40 may be input to a receiver input port 42, which in an embodiment may include hardware components such as an input jack, and may be converted to a digital signal 44 by an A/D converter 46. In embodiments, the received signal 40 and the attenuated signal 26a may be converted to digital signals by a single A/D converter, e.g., a high-speed 14-bit converter, or by multiple A/D converters. The resulting digital received signal 44, also referred to as the primary input signal 44, is then input to a summer 48 and adaptive filter tap weight estimator 50. The digital attenuated signal 34, also referred to as the reference signal 34, is also input to estimator 50 and the digital adaptive filter 52. The tap weight estimator 50 may periodically provide tap weight values to digital filter 52. The digital filter 52 may provide an estimate of the transmitted signal that may be subtracted from the received signal with summer 48 to provide a cancelled signal 54.

The digital adaptive filter 52 and summer 48 are software-controlled and may include a backward adaptive filter tap estimator or a block forward tap estimator, in embodiments. In one embodiment, the adaptive filter/summer difference equation is given by $$y(i) = r(i) - \sum_{k=0}^{M-1} a(k)t(i-k) \quad (1)$$

where y(i) are the output samples, r(i) are the receiver input port samples (also known as the primary input signal), t(i) are the transmitter input port samples (also known as the reference input signal), M is the length of the adaptive filter, and a(k) are the adaptive filter tap weights. The filter taps can be estimated by solution of the following matrix equation:

$$\begin{bmatrix} R_{tt}(0,0) & R_{tt}(0,1) & \ldots & R_{tt}(0, M-1) \\ R_{tt}(1,0) & R_{tt}(1,1) & \ldots & R_{tt}(1, M-1) \\ \ldots & \ldots & \ldots & \ldots \\ R_{tt}(M-1, 0) & R_{tt}(M-1, 1) & \ldots & R_{tt}(M-1, M-1) \end{bmatrix} \begin{bmatrix} a(0) \\ a(1) \\ \ldots \\ a(M-1) \end{bmatrix} = \begin{bmatrix} R_{tr}(0) \\ R_{tr}(1) \\ \\ R_{tr}(M-1) \end{bmatrix} \quad (2)$$

where $$R_{tt}(j,k) = \sum_{i=M-1}^{N-1} t(i-j)t(i-k) \quad (3)$$

and $$R_{tr}(k) = \sum_{i=M-1}^{N-1} r(i)t(i-k) \quad (4)$$

and where N is the length of the block of transmitter input port/receiver input port samples over which to estimate the filter taps.

Once the digital filter 52 provides an estimate of the transmitted signal that may be subtracted from the received signal using the summer 48, the resulting cancelled signal 54 may then be input to a software-controlled digital receiver 56 and may be further processed in any suitable manner. The cancelled signal 54 may be relatively clean from interferences resulting from transmitting and receiving signals over one frequency or channel. In an embodiment, the system 20 may include a bypass switch 58 for passing the signal 40 directly to the receiver 56 without being processed by the digital adaptive filter 52. For example, such an embodiment may be implemented if the signal 40 is degraded or corrupted to such an extent that digital cancellation may not be effective.

In some embodiments, a DFD system such as that illustrated in FIG. 2 may be implemented in one or more nodes or devices of a communication network (e.g., implemented in the network 10 of FIG. 1). These nodes or devices, referred to as DFD enabled nodes, may transmit and receive signals on substantially the same frequency and at substantially the same time while reducing and/or eliminating the effects of signal interference. Such DFD enabled nodes may reduce the effects of bottlenecking in a communication network, as delays and/or data loss associated with time-division and/or frequency-division duplexing may also be reduced.

Figure 3:
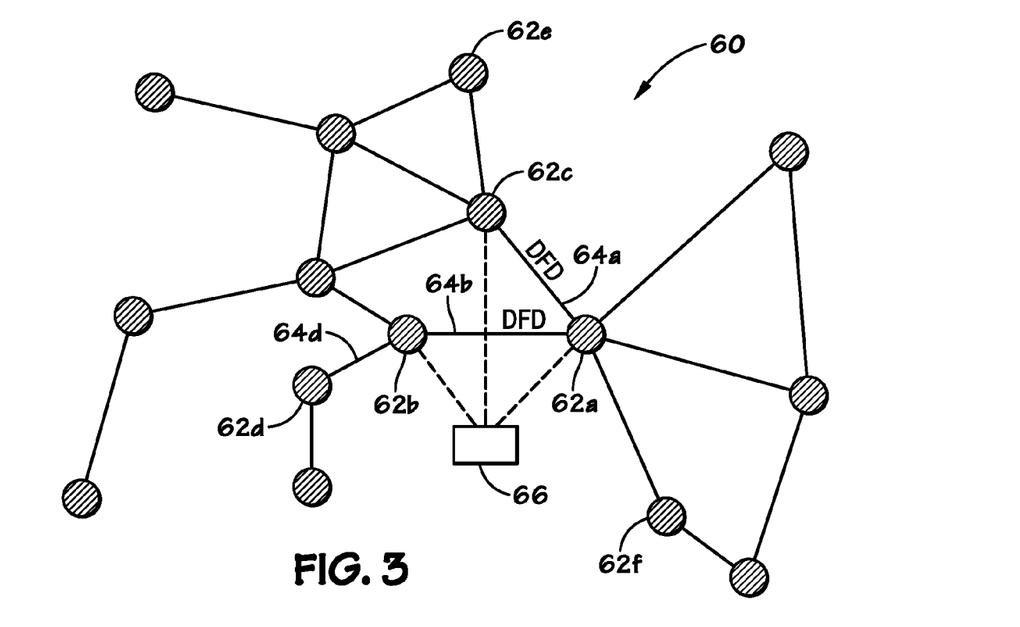
FIG. 3 is an example of a communication network in a mesh network configuration having one or more division-free duplexed links, in accordance with embodiments of the present techniques.

An example of how a DFD system may be implemented in a communication network is provided in the diagram of FIG. 3. The network 60 illustrated in FIG. 3 may include nodes 62 having a fixed location. As the nodes 62 may be fixed, communication routes through the network 60 may be relatively predictable, and potential bottlenecks of overlapping communication routes may be known in advance. In some embodiments, DFD systems may be implemented on nodes 62 which form links that are comparatively susceptible to bottlenecking. For example, for similar reasons as discussed with respect to FIG. 1, potential bottlenecks may occur in network 60 of FIG. 3 on link 64a (between nodes 62a and node 62c) and link 64b (between nodes 62a and 62b).

In one embodiment, DFD equipment may be implemented on the nodes of the links where bottlenecks are likely to occur. For example, DFD systems may be implemented on nodes 62a, 62b, and 62c, such that signals may be transmitted from and received at the nodes 62a-c via the links 64a and 64b at substantially the same time, and over substantially the same frequency. Such DFD equipment may be similar to the system 20 discussed with respect to FIG. 2. In some embodiments, other system configurations which enable division free duplexing may also be used. Nodes 62a-c having DFD equipment may be referred to as DFD enabled nodes 62a-c, and links between DFD enabled nodes 62a-c may be referred to as DFD links 64a and 64b. While only nodes 62a-c may be DFD-enabled in FIG. 3, in some embodiments, DFD equipment may be installed on any and/or all nodes 62 which support high-transmission rate links (e.g., links 64a and 64b). For example, a communication network may have many different nodes, links, and communication routes, and depending on the configuration of the network and the location of the nodes, different bottlenecks may be possible throughout the network. In some embodiments, DFD equipment may be installed on all nodes which support links which transmit signals above a threshold transmission rate. As will be discussed, any suitable processor 66 of the network 60 may be used to configure communication routes and/or control the operation of DFD-enabled nodes in the network 60.

Figure 4:
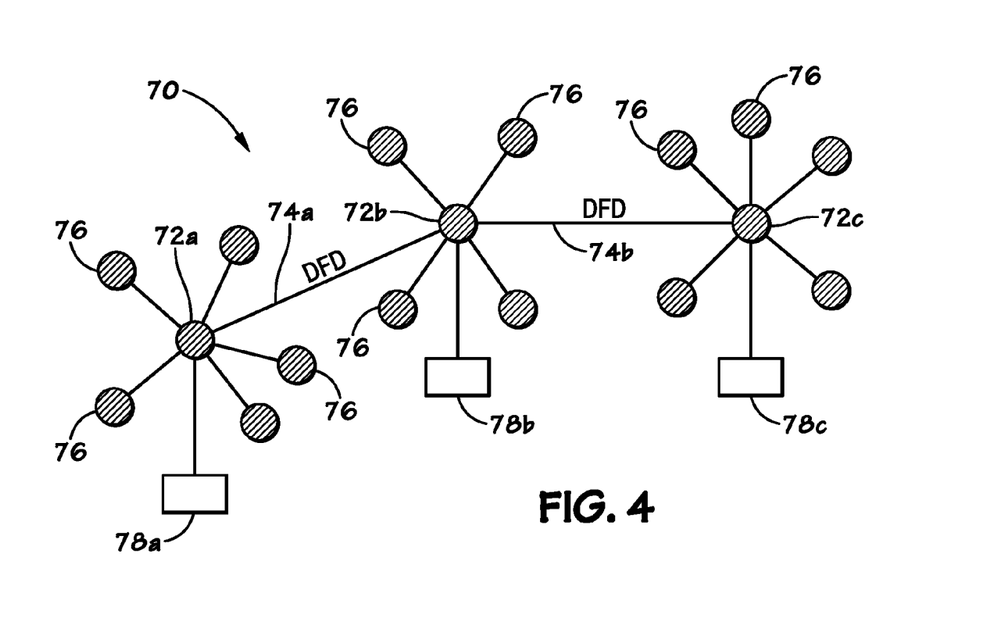
FIG. 4 is an example of a communication network in a star network configuration having one or more division-free duplexed links, in accordance with embodiments of the present techniques.

DFD systems may also be implemented on communication networks having different configurations. For example, while the network 60 of FIG. 3 represents a mesh configuration, the network 70 of FIG. 4 represents network nodes 72 in a star configuration. A network 70 may have one or more nodes 72, which may each be a central node forming a subnetwork which links one or more communication devices 76 within the network 70. Further, more than one node 72 may be linked together (e.g., via links 74), such that one device 76a linked to one node 72a may communicate with another device 76b linked to another node 72b. As devices 76 connected to one node 72a may communicate with devices connected to another node 72b and/or 72c, many communication routes in the network 70 may involve transmitting signals over the links 74a and 74b. In one embodiment, the central nodes 72 may be DFD enabled, and the links 74a and 74b between DFD enabled nodes 72a, 72b, and 72c may be DFD links. One or more processors, such as processors 78 may communicate with the nodes 72a-c to control communication routes and/or control the operation of division free duplexing in the nodes 72a-c. As discussed, implementing division free duplexing systems to transmit signals over DFD links 74a and 74b may decrease delays and/or data loss associated with division duplexing techniques.

In some embodiments, and referring again to FIG. 3, when two nodes (e.g., node 62a and node 62b) in a network 60 are using division free duplexing (e.g., via link 64b) to transmit and receive signals, a third node (e.g., node 62d) may also access the transmissions between the two DFD enabled nodes, even if the third node 62d is not operating in DFD mode. For example, the node 62d may record both parts of the communication between nodes 62a and 62b. The link 64d through which the communication is recorded may not be a DFD link, and without division free duplexing, the signal received at 62d may contain only the transmissions of node 62a. By using the present DFD techniques, the transmissions of node 62b may also be available by estimating a corrupted transmission from node 62a and subtracting it from the recorded communication, such that node 62d may access both the signal transmitted from node 62b and received by node 62a, as well as the signal transmitted by node 62a and received by node 62b.

Further, in one embodiment, medium access control (MAC) techniques such as request-to-send and clear-to-send (RTS and CTS) techniques may also be adapted for a DFD enabled communication network. For example, each DFD enabled node may be able to transmit and receive an RTS signal to initiate a transmission from a requesting node 62e to a requested node 62f. A requesting node 62e may initiate a communication by transmitting an RTS to different nodes (e.g., 62c and 62a), and the RTS transmission may be transmitted through the network 60 until the RTS reaches the requested node 62f. Due to division free duplexing between one or more of the nodes, the RTS signal may be transmitted in one or two directions, as signals may be transmitted in both directions along the same link. For example, in one embodiment, the requested node 62f may receive the RTS from the requesting node and transmit a clear-to-send return-request-to-send (CTS RRTS) signal to begin receiving the transmission from the requesting node 62e, and request that the requesting node 62e simultaneously receive a transmission from the requested node 62f. The requesting node 62e may either transmit a CTS to the CTS RRTS of the requested node 62f, or deny the CTS RRTS if the requesting node 62e is already receiving from a different node. Such techniques may be implemented on any suitable network configuration including the configurations depicted in FIGS. 3 and 4, as well as relay networks, tree networks, and/or rings.

DFD systems may also be used in wireless networks, where the quality of links (e.g., characterized by data rate, error rate, other degradations to the signal quality or a perceived quality of transmitted sound, etc.) may be dynamic. For example, changes in the location of communicating wireless devices may change the quality of the links in a communication route between the devices. In embodiments where the quality of links may be dynamic, DFD enabled nodes may not always be operating in a DFD mode. For example, a conventional mode of operation (e.g., using time-division duplexing and/or frequency-division duplexing) may sometimes perform at an acceptable quality while using less power and/or cost compared to a DFD mode of operation.

In some embodiments, a network 60 having DFD enabled nodes 62 may use conventional duplexing techniques as a default mode of operation, and potential DFD links (e.g., links 64a and 64b) may be monitored to determine whether and/or when the nodes (e.g., nodes 62a-c) which support the potential DFD links may be switched to a DFD mode of operation. Furthermore, some DFD links in a network 60 may be switched to operate in a DFD mode, while other potential DFD links may continue to operate in the conventional mode. For example, DFD enabled nodes 62a and 62c may be switched to operate in DFD mode for division free duplexing in link 64a. However, node 62b may remain operating in conventional mode, and signals may be transmitted over the link 64b using conventional division duplexing techniques.

Determination of whether and/or when a node may be switched to a DFD mode of operation may be based on one or more quality of service (QoS) attributes. For example, QoS may be affected by certain factors such as data rate, packet loss rate, delay, bit error rate, etc. Such factors may lower the perceived quality of communications. Different factors may also cause varying types and degrees of signal degradations in different types of communications (e.g., data transfers, voice communication). In some embodiments, a suitable processor in a communication network, such as the processor 66 in FIG. 2, may use metrics including signal strength metrics and/or voice quality metrics to determine the quality of a link and/or an estimated perceived quality of the communication. The processor 66 may control the operational mode of different nodes by determining whether and/or when to switch the operational mode of a node based on various signal quality metrics.

Furthermore, determining whether and/or when a node may be switched from a conventional mode to a DFD mode may also involve cost considerations. For example, a lower signal quality (e.g., a higher error rate) may be more acceptable for a voice communication as compared to a data transfer, for example, and therefore certain signal quality metrics may not be as heavily weighted in a selection process as cost in a voice communication. Such signal quality metrics may be more heavily weighted in the selection process for communications where error is less acceptable, such as data transfers, for example. In some embodiments, the processor 66 may determine whether and/or when a mode of operation may be switched at a DFD enabled node 62 based on a cost associated with the switch. Further, in some embodiments, QoS determinations may be customizable, and device users may be able to customize a selection process for DFD or conventional operating modes based on a user's communication. For example, a user may select certain levels of desired signal quality based on types of access technologies or types of communication, or may set boundaries for acceptable link costs.

In some embodiments, division free duplexing may be implemented in substantially all nodes for communication networks having mobile nodes, referred to as mobile network nodes. As the spatial location of mobile network nodes may constantly change during a communication, bottlenecking may be more difficult to predict. Thus, in a network having mobile network nodes, DFD equipment may be installed in a greater number of nodes (e.g., as compared to a network having fixed network nodes), or in substantially all the nodes or devices of the network.

Figure 5:
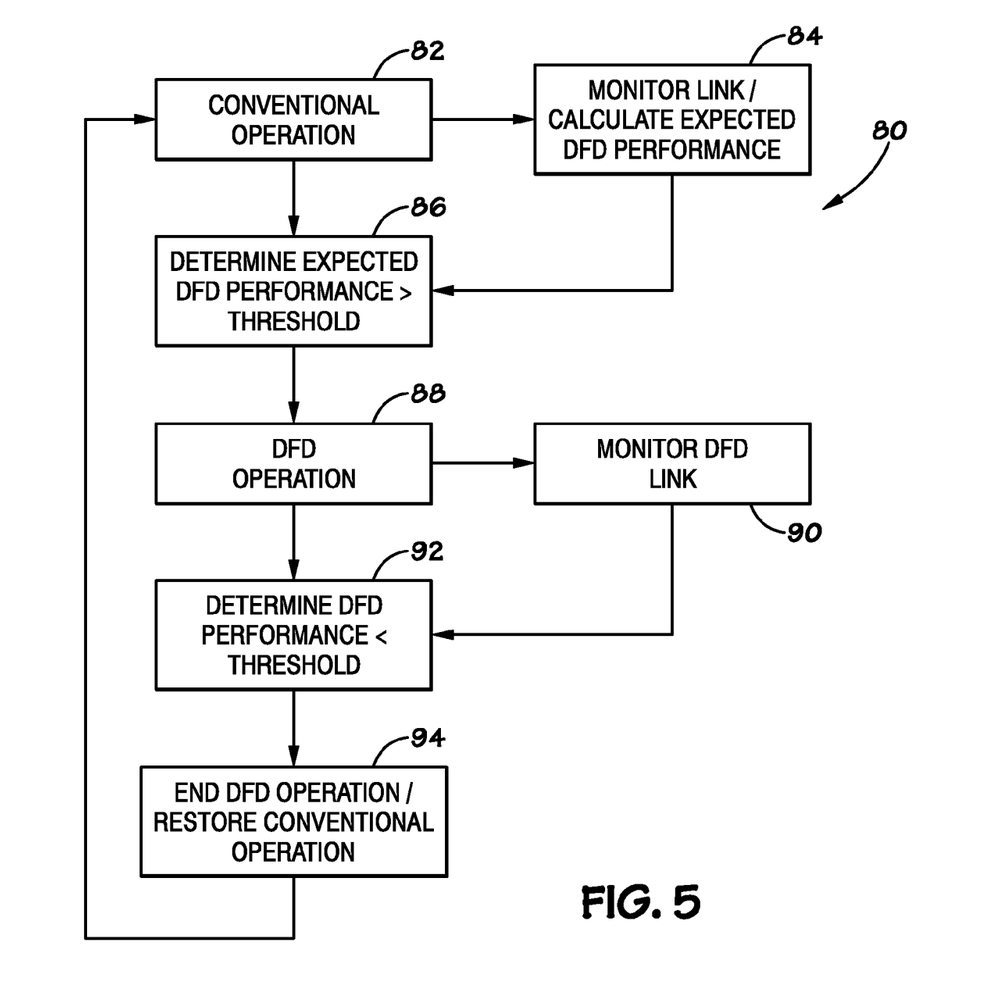
FIG. 5 is a flow chart for monitoring division-free duplexed links in a communication network, in accordance with embodiments of the present techniques.

In some embodiments, the mobile network nodes may operate in a conventional duplexing mode by default, and may switch to a DFD operating mode based on the quality of the link. The flow chart illustrated in FIG. 5 depicts a process 80 for controlling the mode of operation (e.g., DFD or other) for network nodes in a communication network. In embodiments, any suitable processor (e.g., processor 66 in network 60, as in FIG. 2) of a network 60 may be used to control the operation of nodes. The nodes of a link in a communication route may begin operation in a conventional mode (block 82). Throughout the communication, the network, or a suitable processor 66, may monitor (block 84) the link to determine whether and/or when the nodes may be switched from a conventional mode of operation to a DFD mode of operation. Monitoring (block 84) the link may include monitoring parameters of the link to estimate an expected performance in a DFD mode of operation. Such parameters may include received signal strength indication (RSSI), received signal-to-noise ratio (SNR), and channel dynamics, etc. When the network determines (block 86) that the expected performance is above a threshold, the nodes of the link may be switched to operate in a DFD mode (block 88). In some embodiments, a processor may first transmit test data from one DFD transmitter of one node to the DFD receiver of another node. The processor may analyze the received test data and determine whether the received test data is of similar quality to the expected DFD performance. If the test is successful (e.g., if the received data reaches a certain threshold), the DFD equipment may be activated on the nodes.

As discussed, operation in DFD mode (block 88) may include a concurrent transmitting and receiving of data between two or more nodes. The data may include bit data, voice data, or any type of data suitable for communicating information via wireless signal transmission over a selected frequency. Furthermore, in addition to information, the transferred data may also include other signals. In some embodiments, a masking signal may be sent during a DFD communication which may protect information transmitted from one node to another. For example, a first and second node may be in communication, and at least the second node may be operating in a DFD mode. The first node may transmit information to the second node, and the second node may concurrently send a masking signal over the channel on which the first node is transmitting. The masking signal may be unpredictable to a potential eavesdropper, and may have approximately the same average spectral content as the information transmitted by the first node. Further, as the second node may know the masking signal, the second node may remove the masking signal from the signal received by the first node to retrieve the originally transmitted information.

When the nodes of a link are operating in DFD mode (block 88), the network may continue to monitor (block 90) the performance of the link in DFD mode. Monitoring (block 90) the DFD link may include analyzing the RSSI, SNR, channel dynamics, metrics from decoding algorithms, error rate measurements of decoded data, a posterior probability (APP) estimates of the decoded data, or any other metrics or parameters. If DFD performance falls below a threshold, or if DFD performance is predicted to fall below a threshold, DFD operation may be ended, and conventional operation may be restored (block 94).

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of managing a communication in a communication network, the method comprising:
   operating a first network node in the network using a division duplexing technique;
   monitoring parameters of a transmission of the first network node;
   estimating an expected performance for division free duplexing (DFD) operation based on the monitored parameters;
   transmitting a test signal from a second network node to the first network node;
   determining whether the test signal received by the first network node is substantially similar to or better than the expected performance for DFD operation; and
   ceasing to operate the first network node using the division duplexing technique to operate the first network node using a DFD technique when the estimated expected performance for DFD operation reaches a threshold performance level and based on whether the received test signal is substantially similar to or better than the expected performance for DFD operation.

2. The method of claim 1, comprising:
   monitoring a transmission of the first network node while the first network node is operating using the DFD technique to determine a DFD performance; and
   ceasing to operate the first network node using the DFD technique to operate the first network node using the division duplexing technique when the DFD performance falls below a threshold performance level.

3. The method of claim 2, wherein monitoring the transmission of the network node while the network node is operating using the DFD technique comprises measuring one or more of an RSSI, a SNR, channel dynamics, metrics from decoding algorithms, error rate measurements of decoded data, a posterior probability (APP) estimates of the decoded data, and any other metrics or parameters related to a quality of the transmission.

4. The method of claim 1, wherein monitoring the transmission of the first network node to determine the expected performance for DFD operation comprises analyzing one or more of a received signal strength indication (RSSI), a received signal-to-noise ratio (SNR), and channel dynamics from the first network node.

5. The method of claim 1, wherein the DFD technique comprises:
   receiving an analog primary signal;
   receiving an analog reference signal from a transmitter;
   converting the analog primary signal into a digital primary signal;
   converting the analog reference signal into a digital reference signal; and
   processing the digital reference signal with a digital adaptive filter, wherein the digital adaptive filter uses the digital reference signal and digital primary signal as inputs for determining filter weights of the digital adaptive filter to provide an output; and
   subtracting the output of the digital adaptive filter from the digital primary signal to generate a digital cancelled signal.

6. The method of claim 1, comprising:
transmitting a request-to-send (RTS) signal from the network node to a second network node;
transmitting a clear-to-send return-request-to-send (CTS RRTS) signal from the second network node to the network node, wherein the second network node is operating using the DFD technique;
transmitting data from the network node to the second network node in response to the CTS RRTS signal; and
transmitting either a deny signal or a CTS signal from the network node to the second network node in response to the CTS RRTS signal.

7. The method of claim 6, comprising transmitting the data from the second network node to the first network node when the first network node transmits a CTS signal, such that the transmission of the data from the first network node to the second network node is occurring substantially simultaneously as the transmission of the data from the second network node to the first network node.

8. The method of claim 1, comprising:
receiving an incoming data signal at a first frequency at the first network node from a second network node;
transmitting a masking signal over the first frequency; and
removing the masking signal from the received incoming data signal.

9. A communication system, comprising:
a plurality of nodes, wherein one or more nodes of the plurality of nodes are division free duplex (DFD) enabled nodes, wherein the DFD enabled nodes comprise DFD equipment and are configured to operate in a DFD mode or a division duplexing mode; and
a processor configured to substantially control a mode of operation of the DFD enabled nodes, to monitor parameters of the DFD enabled nodes and to estimate an expected performance of the DFD enabled nodes in DFD operation based on the monitored parameters wherein the mode of operation is based on the expected performance of the DFD enabled nodes in DFD operation such that the DFD enables nodes are operated in DFD mode when the estimated expected performance for DFD operation reaches a threshold performance level, and wherein the DFD enabled nodes comprise instructions for:
receiving a primary signal;
receiving a reference signal from a transmitter;
processing the reference signal with an adaptive filter, wherein the adaptive filter uses the reference signal and primary signal as inputs for determining filter weights of the adaptive filter to provide an output; and
subtracting the output of the adaptive filter from the primary signal to generate a cancelled signal.

10. The communication system of claim 9, wherein a communication between two or more of the plurality of nodes is transmitted via a communication route comprising one or more links connecting each of the plurality of nodes, and wherein multiple communication routes in the system overlap on one or more high transmission rate links.

11. The communication system of claim 10, wherein the one or more high transmission rate links are between the DFD enabled nodes.

12. The communication system of claim 9, wherein substantially all of the plurality of nodes are DFD enabled nodes.

13. The communication system of claim 9, wherein the DFD enabled nodes operate in the division duplexing mode until the processor changes the mode of operation such that one or more of the DFD enabled nodes operate in the DFD mode.

14. The communication system of claim 9, wherein signals are transmitted between the DFD enabled nodes via DFD links, and wherein the processor is configured to change the mode of operation of the DFD enabled nodes based on an analysis of one or more of a received signal strength indication (RSSI), a received signal-to-noise ratio (SNR), channel dynamics, metrics from decoding algorithms, error rate measurements of decoded data, a posterior probability (APP) estimates of the decoded data of the DFD links.

15. The communication system of claim 14, wherein the processor is configured to change the mode of operation of the DFD enabled nodes based on a cost associated with operating in the DFD mode.

16. The communication system of claim 9, wherein the processor is configured to identify bottlenecking in the communication system and configured to control the mode of operation of the DFD enabled nodes based on the identified bottlenecking.

17. The communication system of claim 9, wherein the primary signal is received from a receiver front end, an antenna, or a receiver input port.

18. A method, comprising:
operating a first node and a second node in a communication network by using a division duplexing technique;
operating the first node and the second node by using a division free duplexing (DFD) technique
monitoring parameters of a communication between the first node and the second node;
estimating an expected performance for DFD operation based on the monitored parameters;
transmitting a request-to-send (RTS) signal from the first node to the second network node;
transmitting a clear-to-send return-request-to-send (CTS RRTS) signal from the second network node to the first network node;
transmitting data from the first network node to the second network node in response to the CTS RRTS signal; and
transmitting either a deny signal or a CTS signal from the first network node to the second network node in response to the CTS RRTS signal; and
comprising transmitting the data from the second network node to the first network node when the first network node transmits a CTS signal, such that the transmission of the data from the first network node to the second network node is occurring substantially simultaneously as the transmission of the data from the second network node to the first network node.

19. The method of claim 18, comprising changing from operating the first node and the second node using the DFD technique to operating the first node and the second node using the division duplexing technique based on a monitored quality of the communication.

20. The method of claim 19, comprising changing from operating the first node and the second node using the division duplexing technique to operating the first node and the second node using the DFD technique based on a monitored quality of the communication.

21. The method of claim 18, comprising recording the communication between the first node and the second node using a third node coupled to the second node, wherein the recorded communication comprises a first transmission from the first node to the second node and a second transmission from the second node to the first node.

22. The method of claim 18, wherein a quality of the communication is determined by analyzing one or more of a received signal strength indication (RSSI), a received signal-to-noise ratio (SNR), channel dynamics, metrics from decoding algorithms, error rate measurements of decoded data, a posterior probability (APP) estimates of the decoded data of the communication.

23. The method of claim 18, wherein operating the first node and the second node by using the DFD technique comprises:
  receiving at the first node a signal comprising information from the second node;
  transmitting a masking signal from the first node; and
  removing the masking signal from the signal to recover the information.

* * * * *